(12) United States Patent
Ohtsuki et al.

(10) Patent No.: US 7,633,305 B2
(45) Date of Patent: Dec. 15, 2009

(54) METHOD FOR EVALUATING SEMICONDUCTOR WAFER AND APPARATUS FOR EVALUATING SEMICONDUCTOR WAFER

(75) Inventors: Tsuyoshi Ohtsuki, Gunma (JP); Hideki Sato, Gunma (JP)

(73) Assignee: Shin-Etsu Handotai Co., Ltd., Tokyo (JP)

( * ) Notice: Subject to any disclaimer, the term of this patent is extended or adjusted under 35 U.S.C. 154(b) by 0 days.

(21) Appl. No.: 11/661,276

(22) PCT Filed: Sep. 12, 2005

(86) PCT No.: PCT/JP2005/016707
§ 371 (c)(1),
(2), (4) Date: Feb. 27, 2007

(87) PCT Pub. No.: WO2006/030723
PCT Pub. Date: Mar. 23, 2006

(65) Prior Publication Data
US 2007/0279080 A1    Dec. 6, 2007

(30) Foreign Application Priority Data
Sep. 13, 2004    (JP)    ............................. 2004-265800

(51) Int. Cl.
*G01R 31/02* (2006.01)
*G01R 31/26* (2006.01)
(52) U.S. Cl. ...................................... 324/755; 324/765
(58) Field of Classification Search ......... 324/754–765, 324/158.1
See application file for complete search history.

(56) References Cited

U.S. PATENT DOCUMENTS 4,360,964 A * 11/1982 Gilly et al. .................... 438/10

(Continued)

FOREIGN PATENT DOCUMENTS

JP    A 61-159748    7/1986

(Continued)

OTHER PUBLICATIONS

Cristoloveanu et al.; "A Review of the Pseudo-MOS Transistor in SOI Wafers: Operation, Parameter Extractions, and Applications;" IEEE Transactions on Electron Devices; vol. 47; No. 5; May 2000; pp. 1018-1027.

(Continued)

*Primary Examiner*—Ha Tran T Nguyen
*Assistant Examiner*—Joshua Benitez
(74) *Attorney, Agent, or Firm*—Oliff & Berridge, PLC

(57) ABSTRACT

The present invention is a method for evaluating a semiconductor wafer by measuring an electric characteristic of the semiconductor wafer by using a mercury electrode, wherein when the semiconductor wafer is held on a wafer chuck that the mercury electrode is formed in a holding surface of so that a side of a surface to be measured of the semiconductor wafer is set to a side of the wafer chuck, the semiconductor wafer is held on the wafer chuck whose diameter forming an outermost periphery of the holding surface is smaller than a diameter forming an outermost periphery of the surface to be measured of the semiconductor wafer, and then, the electric characteristic is measured by contacting the mercury electrode with the surface to be measured of the wafer, and an evaluation apparatus. Thereby, there can be provided an evaluation method and an evaluation apparatus for a semiconductor wafer by which when the semiconductor wafer is evaluated by measuring an electric characteristic thereof by using a mercury electrode, the semiconductor wafer can be high-precisely and effectively evaluated by setting a size of a holding surface of a wafer chuck to be smaller than that of a surface to be measured of the semiconductor wafer that is an object to be measured.

4 Claims, 5 Drawing Sheets

U.S. PATENT DOCUMENTS

| | | | |
|---|---|---|---|
| 5,036,271 A | | 7/1991 | Mazur et al. |
| 5,585,736 A | * | 12/1996 | Hshieh et al. ............... 324/754 |
| 6,468,816 B2 | * | 10/2002 | Hunter ........................ 438/14 |
| 6,469,535 B1 | | 10/2002 | Egashira et al. |
| 6,492,827 B1 | * | 12/2002 | Mazur et al. ................ 324/761 |
| 6,915,232 B2 | * | 7/2005 | Kitajima et al. ............. 702/171 |
| 2003/0042921 A1 | * | 3/2003 | Hollman ..................... 324/754 |
| 2005/0151549 A1 | * | 7/2005 | Okumura et al. ............ 324/756 |
| 2005/0194990 A1 | * | 9/2005 | Gothoskar et al. .......... 324/765 |
| 2007/0018674 A1 | * | 1/2007 | Cho et al. ................... 324/765 |

FOREIGN PATENT DOCUMENTS

| | | | |
|---|---|---|---|
| JP | A 06-140478 | | 5/1994 |
| JP | A 2000-068344 | | 3/2000 |
| JP | A 2001-060676 | | 3/2001 |
| JP | A 2001-244309 | | 9/2001 |
| JP | A 2001-267384 | | 9/2001 |
| JP | A 2002-176081 | | 6/2002 |
| JP | A 2003-031633 | | 1/2003 |
| JP | A 2003-100831 | | 4/2003 |

OTHER PUBLICATIONS

Hovel; "Si film electrical characterization in SOI substrates by the HgFET technique;" Solid-State Electronics; 2003; pp. 1-23.

* cited by examiner $$Dit = [\ \frac{SSL}{\ln 10}\ (\ \frac{q}{kT} - \frac{1}{E_F T_{Si}}\ )\ C_{ox} - (C_{ox} + C_{Si})\ ] / q$$

$$\sim \frac{SSL\ 16.77\ C_{ox} - (C_{ox} + C_{Si})}{q} \qquad \text{(at 300K)}$$

METHOD FOR EVALUATING SEMICONDUCTOR WAFER AND APPARATUS FOR EVALUATING SEMICONDUCTOR WAFER

TECHNICAL FIELD

The present invention relates to an evaluation method and an evaluation apparatus for evaluating a semiconductor wafer by measuring an electric characteristic of the semiconductor wafer, and more specifically relates to an evaluation method and an evaluation apparatus for a semiconductor wafer by which the semiconductor wafer can be high-precisely evaluated by improving a wafer chuck that holds the semiconductor wafer in evaluating the semiconductor wafer and that a mercury electrode is formed in.

BACKGROUND ART

As a semiconductor wafer used now, for example, there are a silicon wafer, an epitaxial (EP) wafer, a wafer of Silicon on Insulator (SOI), and so forth. Semiconductor devices are produced by forming devices on these wafers. In recent years, a semiconductor device has been required to be finer, to be higher integrated, to have a higher speed, to have a higher yield, and so on. It has been said that among them, performance or yield of a formed semiconductor wafer reflects quality of the wafer.

For example, quality of a thermal oxide film formed by thermally oxidizing the semiconductor wafer is one of particularly important qualities in the semiconductor wafer, and reflects goodness or badness of the condition of forming the oxide film, crystal quality in a surface of the semiconductor wafer, and so forth. Moreover, an electric characteristic of a Metal Insulator Semiconductor (MIS) capacitor reflects quality of an insulator film formed on the semiconductor wafer, and particularly reflects crystal quality in a surface of the semiconductor wafer and in the vicinity of the surface, as well as the quality itself of the insulator film. It has been more important from now to provide semiconductor wafers of high quality by making it possible to higher-sensitively and higher-precisely evaluate an electric characteristic of the insulator film formed on the semiconductor wafer.

However, in the case of forming a MIS capacitor for evaluating a semiconductor wafer, a process of forming the MIS capacitor requires a large-scale apparatus and multiple steps and there had been troubles such as large burden to cost and lack of rapidity.

Accordingly, methods for evaluating a semiconductor wafer by using an electrode made of mercury being excellent in convenience have been developed. And, there have been proposed C-V method of measuring an interface state in the interface between the semiconductor wafer and the oxide film, a dopant density of the bulk in the semiconductor wafer, or the like, and Pseudo MOS FET method for evaluating an SOI wafer (see, for example, Japanese Patent Application Laid-open (kokai) No. 2001-60676, Japanese Patent Application Laid-open (kokai) No. 2001-267384, and S. Cristoloveanu et al., "A Review of the Pseudo-MOS Transistor in SOI Wafers: Operation, Parameter Extraction, and Applications" IEEE Trans. Electron Dev, 47, 1018 (2000), H. J. Hovel, "Si film electrical characterization in SOI substrates by HgFET technique", Solid-State Electronics, 47, 1311 (2003)).

However, in such evaluation methods, the contact state between the semiconductor wafer and the electrode is very important for obtaining a C-V characteristic or a FET characteristic.

For example, in Japanese Patent Application Laid-open (kokai) No. 2001-60676 or Japanese Patent Application Laid-open (kokai) No. 2001-267384, a method of spearing and contacting a needle-shaped probe as the electrode has been disclosed. However, there is a problem that in the case of a needle-shaped probe, the tip end of the needle is distorted or friction scrap of the object to be measured adheres thereto, and thereby contact resistance becomes larger.

On the other hand, in S. Cristoloveanu et al., "A Review of the Pseudo-MOS Transistor in SOI Wafers: Operation, Parameter Extraction, and Applications" IEEE Trans. Electron Dev, 47, 1018 (2000), or in H. J. Hovel, "Si film electrical characterization in SOI substrates by HgFET technique", Solid-State Electronics, 47, 1311 (2003), a mercury probe is used as the electrode. In such mercury to be used as an electrode, foreign matter such as dust is occasionally mixed in evaluating a semiconductor wafer. The mercury electrode is directly in contact with the semiconductor wafer and an electric characteristic thereof is measured. Therefore, the mercury electrode is very sensitive to contamination in the mercury. If foreign matter such as dust is mixed in the mercury, the foreign matter causes change of the contact area between the wafer and the mercury electrode, and serves as a leak source or an insulator, depending on a type of the impurities. Therefore, occasionally, the electric conductivity has become unstable and abnormality has been shown in the measured electric characteristic.

In order to solve the problem in the semiconductor wafer evaluation due to such mixing of foreign matter to the mercury, for example, in Japanese Patent Application Laid-open (kokai) No. H06-140478, there has been disclosed a contact type inspection apparatus in which pressures in a pressure chamber for adjusting a height of a probe head and in a pressure chamber for thrusting mercury are certainly held to predetermined set values and by which labor of an operation for setting pressure and an operation for adjusting the pressure can be reduced and high precision inspection can be performed.

DISCLOSURE OF THE INVENTION

However, even if the foreign matter in the mercury are completely removed, if a minute electric current to be measured is less than approximately $10^{-7}$ A, it has been impossible to measure the minute current.

Accordingly, the present invention has been accomplished to solve the above-mentioned problems. An object of the present invention is to provide an evaluation apparatus and an evaluation method for a semiconductor wafer by which when the semiconductor wafer is evaluated by measuring an electric characteristic of the semiconductor wafer by using a mercury electrode, the semiconductor wafer can be high-precisely and effectively evaluated by setting a size of a holding surface of a wafer chuck to be smaller than that of a surface to be measured of the semiconductor wafer that is an object to be measured.

To achieve the above object, the present invention provides a method for evaluating a semiconductor wafer by measuring an electric characteristic of the semiconductor wafer by using a mercury electrode, wherein when the semiconductor wafer is held on a wafer chuck that the mercury electrode is formed in a holding surface of so that a side of a surface to be measured of the semiconductor wafer is set to a side of the wafer chuck, the semiconductor wafer is held on the wafer chuck whose diameter forming an outermost periphery of the holding surface is smaller than a diameter forming an outermost periphery of the surface to be measured of the semiconductor wafer, and then, the electric characteristic is measured by contacting the mercury electrode with the surface to be measured of the wafer.

When an electric characteristic of a semiconductor wafer is measured by an electrode in which mercury is used, by setting a diameter forming an outermost periphery of the holding surface of the wafer chuck to be smaller than a diameter forming an outermost periphery of the surface to be measured of the semiconductor wafer, it is possible to suppress the current leaking through a side face of the semiconductor wafer to the opposite surface side (back surface side), and therefore, it becomes possible to measure a minute electric current of $10^{-7}$ A or less, and consequently to accurately obtain a value of electric property of the semiconductor wafer.

In the above case, it is preferable that the semiconductor wafer is an SOI wafer, and in a side of the surface to be measured of the SOI wafer, a MESA part in which an SOI layer providing the surface to be measured is partially left is formed. When the semiconductor wafer is an SOI wafer and an SOI layer of the SOI wafer is partially left and set to be a MESA part and a surface of the SOI layer of the MESA part is set to be the surface to be measured, the peripheral region of the surface to be measured can be set to be a BOX film (Buried Oxide Film) that is an insulator film, and therefore, it is possible to more suppress the current leaking through a side face of the semiconductor wafer to the opposite surface side.

In this case, it is preferable that the diameter forming the outermost periphery of the holding surface of the wafer chuck is equal to or more than 0.5, and less than 1.0 times of the diameter forming the outermost periphery of the surface to be measured of the semiconductor wafer. When the diameter forming the outermost periphery of the holding surface of the wafer chuck is equal to or more than 0.5, and less than 1.0 times of the diameter forming the outermost periphery of the surface to be measured of the semiconductor wafer, it is possible to certainly suppress the current leaking through a side face of the semiconductor wafer to the opposite surface side (back surface side).

It is preferable that when the electric characteristic of the semiconductor wafer is measured, a relative humidity of an atmosphere is controlled to less than 50%. By controlling a relative humidity of an atmosphere to less than 50%, it is possible to more certainly suppress the current leaking through a side face of the semiconductor wafer to the opposite side.

In addition, in this case, humidity of the room in which the measurement apparatus is placed may be controlled by air-conditioning to control a relative humidity of the room itself to less than 50%, or it may be constituted that the measurement apparatus is covered, for example, by a hermetically sealed type box, dried air or dried nitrogen passed through purification equipment is made to blow in the vicinity of the wafer chuck.

Moreover, the apparatus for evaluating a semiconductor wafer according to the present invention is an apparatus for evaluating a semiconductor wafer by measuring an electric characteristic of the semiconductor wafer by using a mercury electrode, comprising, at least, a wafer chuck for holding the semiconductor wafer on a holding surface thereof so that a side of a surface to be measured of the semiconductor wafer is set to a side of the wafer chuck, a probe part in which the mercury electrode is formed in the holding surface of the wafer chuck, wherein a diameter forming an outermost periphery of the holding surface of the wafer chuck is smaller than a diameter forming an outermost periphery of the surface to be measured of the semiconductor wafer.

In an apparatus by which a semiconductor wafer is evaluated by measuring an electric, characteristic of the semiconductor wafer by an electrode in which mercury is used, by setting a diameter forming an outermost periphery of the holding surface of the wafer chuck to be smaller than a diameter forming an outermost periphery of the surface to be measured of the semiconductor wafer, it is possible to suppress the current leaking through a side face of the semiconductor wafer to the opposite surface side (back surface side), and therefore, it becomes possible to measure a minute electric current of $10^{-7}$ A or less and therefore to accurately obtain a value of electric property of the semiconductor wafer.

In this case, it is preferable that the diameter forming the outermost periphery of the holding surface of the wafer chuck is equal to or more than 0.5, and less than 1.0 times of the diameter forming the outermost periphery of the surface to be measured of the semiconductor wafer. When the diameter forming the outermost periphery of the holding surface of the wafer chuck is equal to or more than 0.5, and less than 1.0 times of the diameter forming the outermost periphery of the surface to be measured of the semiconductor wafer, it is possible to certainly suppress the current leaking through a side face of the semiconductor wafer to the opposite surface side (back surface side).

In addition, if the diameter forming the outermost periphery of the holding surface of the wafer chuck is less than 0.5 times of the diameter forming the outermost periphery of the surface to be measured of the semiconductor wafer, there is a risk that the held semiconductor wafer becomes unstable, and on the other hand, if 1.0 times or more, it becomes impossible to suppress the current leaking through a side face of the semiconductor wafer to the opposite surface side.

Furthermore, it is preferable that the semiconductor wafer is an SOI wafer, and in a side of the surface to be measured of the SOI wafer, a MESA part in which an SOI layer providing the surface to be measured is partially left is formed. When the semiconductor wafer is an SOI wafer and an SOI layer of the SOI wafer is partially left and set to be a MESA part and a surface of the SOI layer of the MESA part is set to be the surface to be measured, the peripheral region of the surface to be measured can be set to be a BOX film that is an insulator film, and therefore, it is possible to certainly suppress the current leaking through a side face of the semiconductor wafer to the opposite surface side.

Moreover, it is preferable that the apparatus for evaluating a semiconductor wafer comprises, at least, a chamber for sealing in hermetically and surrounding the wafer chuck and the semiconductor wafer held on the wafer chuck, and an air-conditioning apparatus for controlling a relative humidity of an atmosphere in the chamber to less than 50%. Because the apparatus for evaluating a semiconductor wafer comprises a chamber for sealing in hermetically and surrounding the wafer chuck and the semiconductor wafer held on the wafer chuck and an air-conditioning apparatus for controlling a relative humidity of an atmosphere in the chamber to less than 50%, by controlling a relative humidity of an atmosphere to less than 50% when an electric characteristic of the semiconductor wafer is measured, it is possible to more certainly suppress the current leaking through a side face of the semiconductor wafer to the opposite side.

As described above, according to the present invention, because the size of the wafer chuck is set to be smaller than that of the surface to be measured of the semiconductor wafer, it is possible to reduce the leakage current to the opposite side of the semiconductor wafer that is an object to be measured. And, because the measurable lower limit of the current value in a minute current region is improved from $10^{-7}$ A to $10^{-11}$ A, it becomes possible to measure a pA level. Thereby, accuracy of Dit (interface state density) calculated from a slope of an I-V curve in a subthreshold region is improved. It becomes possible to obtain higher-reliable and stabler measurement results. Consequently, the present invention can contribute to improvement of quality of a semiconductor wafer.

BEST MODE FOR CARRYING OUT THE INVENTION

Hereinafter, embodiments according to the present invention will be explained specifically. However, the present invention is not limited thereto.

Figure 7:
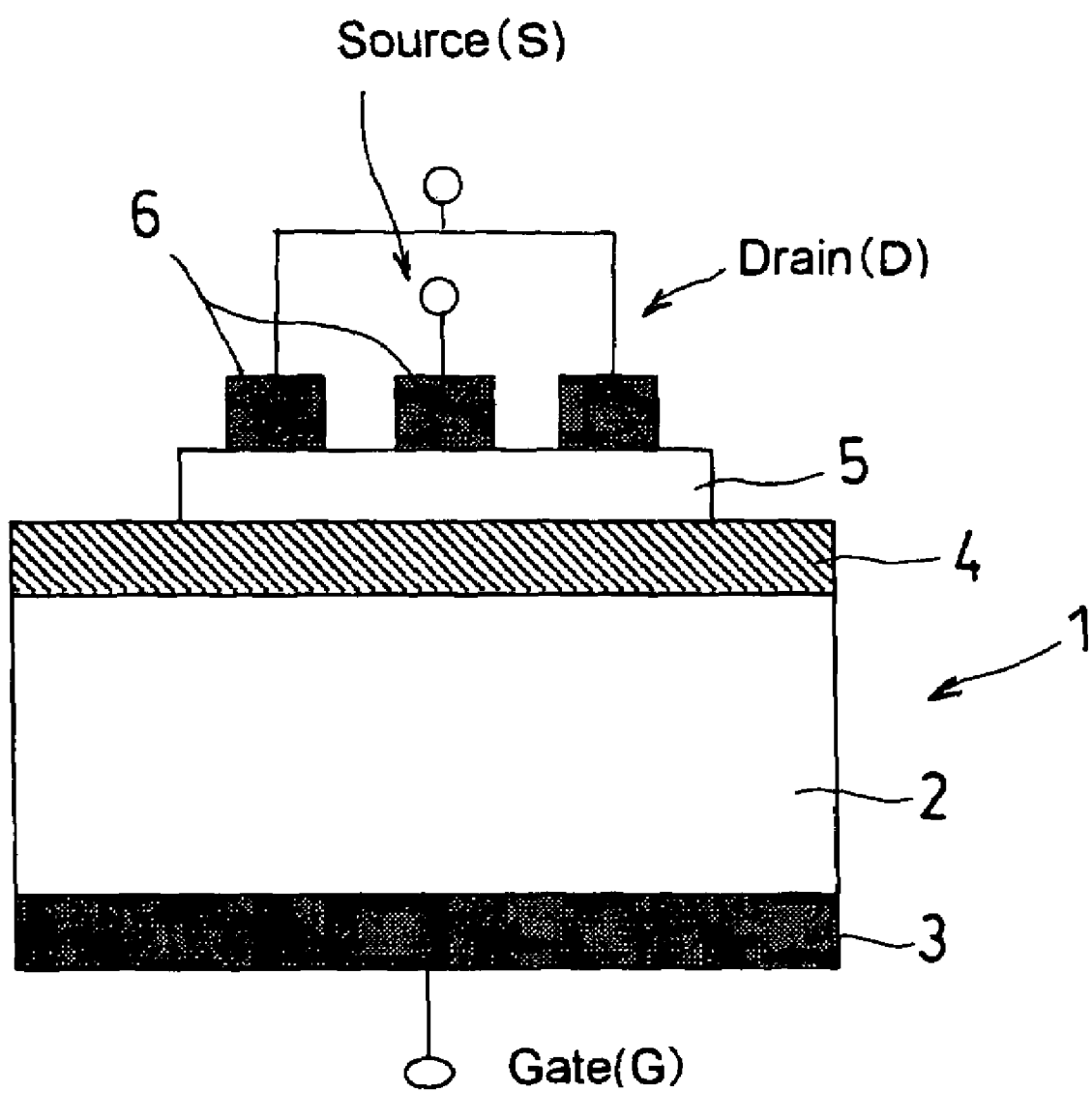
FIG. 7 is a schematic section view for explaining Pseudo-MOSFET measurement method.
Figure 8:
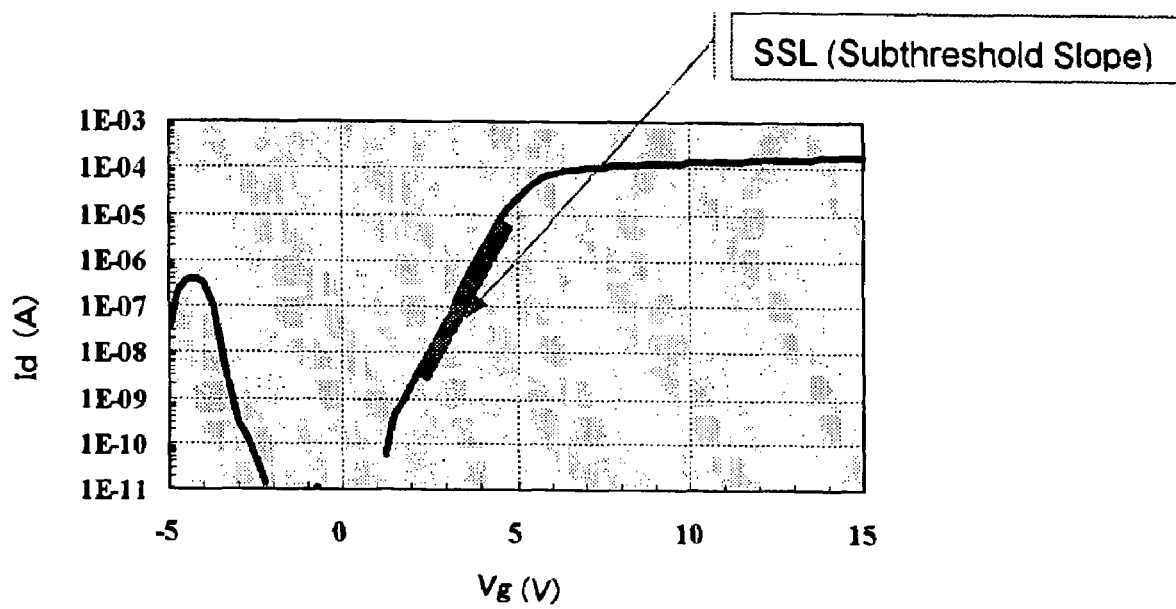
FIG. 8 is an explanatory view for explaining a method for calculating an interface state density from an Id-Vg curve of Pseudo-MOSFET.

FIG. 7 is a view for explaining Pseudo-MOSFET measurement method by using a mercury electrode disclosed in H. J. Hovel, "Si film electrical characterization in SOI substrates by HgFET technique", Solid-State Electronics, 47, 1311 (2003). In this method, a metal electrode 3 is provided on a back surface of a base wafer 2 of an SOI wafer 1 and set to be a gate electrode. On the other hand, mercury electrodes 6 to be a source electrode and a drain electrode are contacted with the surface of an SOI layer 5 on a BOX film 4. By measuring a current flowing between the source electrode and the drain electrode in changing gate voltage, the evaluation of the interface between the SOI layer and the BOX film is performed. In particular, as shown in FIG. 8, the evaluation of an interface state density (Dit) is calculated from a slope (SSL) of a Vg-Id curve in a subthreshold region when a drain current Id (A) is plotted in a log scale in changing a gate voltage Vg (V). Therefore, for the stable evaluation, it is necessary that the drain current can be measured from several tens of pA.

In the case of actually forming a mercury electrode with a mercury probe, it is necessary to contact a mercury (source) with an SOI wafer (sample wafer) in the central part of a ring-shaped mercury (drain) and that the SOI layer surface is placed in the side of the wafer chuck. Therefore, even if any material with insulating property is used for the wafer chuck and a MESA structure is adopted for the SOI wafer to expose the BOX film and the current flowing on the SOI wafer surface is insulated, leakage is easily caused from the periphery (edge) of the SOI wafer to a gate side that is the back surface thereof.

As described above, the present inventors have noticed the point that due to the leakage to the gate side caused by the wafer chuck, the measurable lower limit of the drain current becomes on 1E-7A, and therefore the current between the source electrode and the drain electrode cannot be accurately measured. The present invention has been accomplished.

Figure 1:
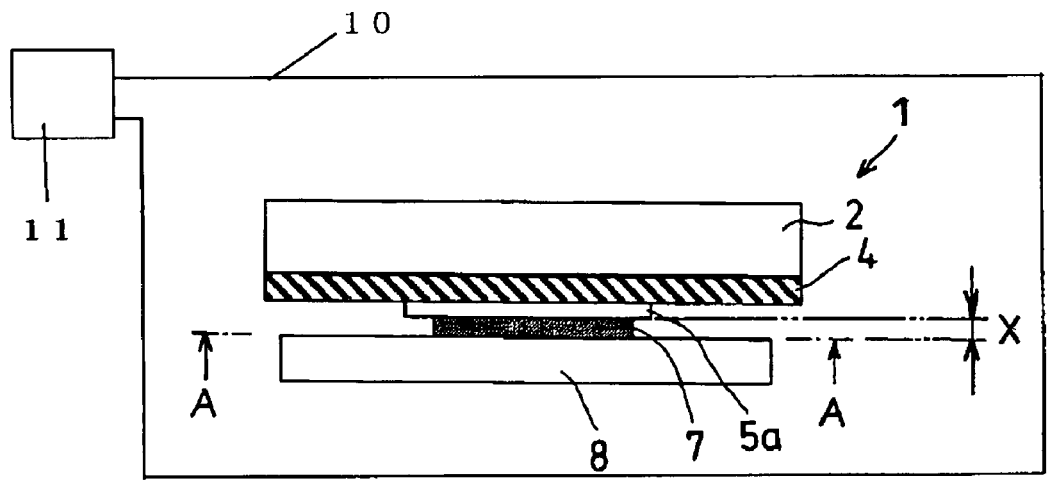
FIG. 1 is a schematic section view of an evaluation apparatus according to the present invention.
Figure 2:
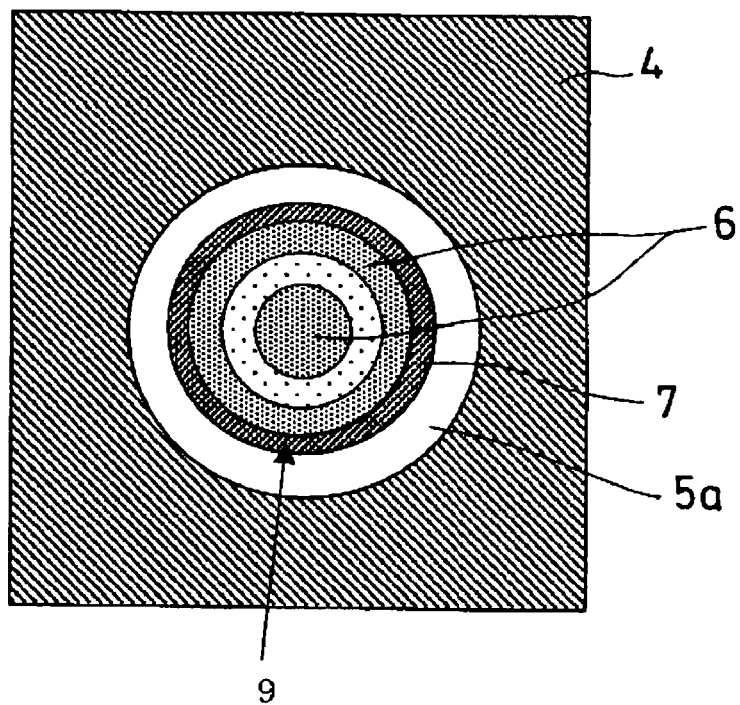
FIG. 2 is a perspective view showing the apparatus toward the upper side of FIG. 1 along the A-A line in FIG. 1.

As shown in FIGS. 1 and 2, in a method for evaluating a semiconductor wafer according to the present invention, when a semiconductor wafer, particularly, an SOI wafer 1 is subjected to a Pseudo-MOS evaluation, a MESA structure is produced and a wafer chuck 7 having an area being certainly smaller than that of the MESA part (silicon island) 5*a* which is partially left part of the SOI layer 5 is used. That is, the SOI wafer 1 is placed and held on the wafer chuck 7 supported on a wafer chuck-holding part 8 so that a front surface side of the MESA part 5*a* is set to the side of the wafer chuck 7. In the holding surface of the wafer chuck 7, mercury electrodes 6 to be a ring-shaped drain electrode and a source electrode positioned in the central part of the ring-shaped drain electrode are formed. On the other hand, a metal electrode is provided to set to be a gate electrode on the back surface of the base wafer 2 of the SOI wafer 1. By measuring a current flowing between the source electrode and the drain electrode in changing gate voltage, the evaluation of the interface between the SOI layer and the BOX film is performed. In the evaluation method, the diameter forming an outermost periphery of the holding surface of the wafer chuck 7 is smaller than a diameter forming an outermost periphery of the surface (the surface to be measured) of the MESA part 5*a* of the SOI wafer 1.

An evaluation apparatus for conducting the evaluation method comprises, at least, the wafer chuck 7, and a probe part 9 in which the mercury electrodes 6 are formed.

Moreover, the apparatus comprises, at least, a chamber 10 for sealing in hermetically and surrounding the wafer chuck 7 and the SOI wafer 1, and an air-conditioning apparatus 11 being capable of controlling a relative humidity of an atmosphere in the chamber 10 to less than 50%.

In such an evaluation method and such an evaluation apparatus, a part other than the MESA part 5*a* of the SOI wafer 1 becomes completely in an insulating state by the air, the leakage current to the gate side can be suppressed. That is, first, by producing a MESA structure, the SOI layer 5 in a peripheral part of the mercury electrode 6 is removed to expose the BOX film 4, and the unnecessary current flowing on the surface of the SOI wafer 1 is excluded. Furthermore, the periphery of the SOI wafer 1 is not in contact with the wafer chuck 7 and an air lies therein, and thereby, leakage from the edge of the SOI wafer 1 to the wafer chuck 7 and to periphery thereof is removed, and thereby stable measurement becomes possible.

It is preferable that the diameter forming the outermost periphery of the holding surface of the wafer chuck 7 is equal to or more than 0.5, and less than 1.0 times of the diameter forming the outermost periphery of the surface of the MESA part 5*a* of the semiconductor wafer 1. More than 0.5 and less than 0.98 times are more preferable.

Moreover, it is desirable that nothing is in contact with the peripheral part (the BOX film 4 in FIG. 1) of the SOI wafer 1. As an air gap X into which an air can get between the wafer chuck supporting part 8 and the surface to be measured namely the MESA part 5*a*, at least, 1 μm is required (see, FIG. 1). If the gap is less than 1 μm, the wafer chuck supporting part 8 and the SOI wafer 1 are contacted due to effect of inclination or flatness of the SOI wafer 1, and therefore, it becomes impossible to perform stable measurement. On the other hand, there is no upper limit of the air gap, and a structure with a full interval is more desirable.

In addition, because an air lies therein, environment in the measurement, particularly humidity, has an influence. It is more preferable that the humidity is 50% or less as the environment of a clean room because insulating property can be certainly maintained.

Hereinafter, the present invention will be explained in detail with reference to Example of the present invention. However, these do not limit the present invention.

EXAMPLE

Figure 3:
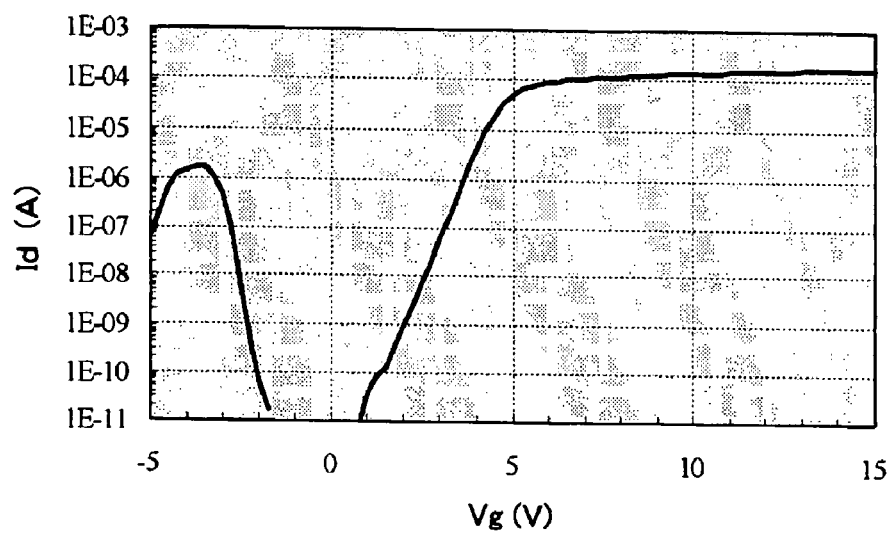
FIG. 3 is an Id-Vg curve of Example.
Figure 5:
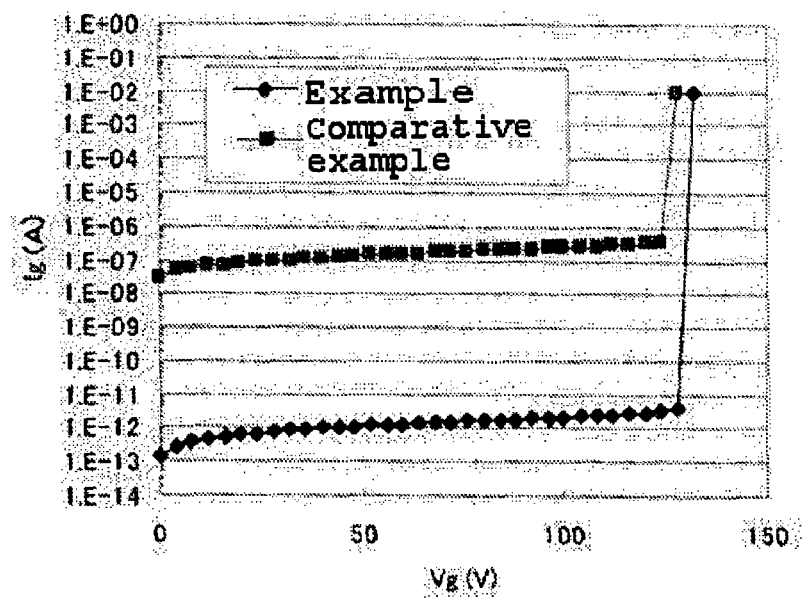
FIG. 5 is an Ig-Vg curve of Example and Comparative example.

As a test portion for the present Example, an SOI wafer produced by using a silicon single crystal wafer of P type having a diameter of 200 mm and a crystal orientation of <100> was used. In addition, the dopant of the P type wafer was boron. Moreover, thicknesses of SOI layer/BOX film were approximately 100/145 nm. A sample was cut from the present SOI wafer 1 so as to have 10-mm sides, and the SOI layer was etched with a solution of 5% TMAH (Tetra Methyl Ammonium Hydroxide), and thereby the MESA structure was produced. Then, after the treatment with 1% HF for 1 min, rinsing was performed by pure water. Then, moisture was removed by a dry air. By using this sample, Pseudo-MOSFET measurement described in H. J. Hovel, "Si film electrical characterization in SOI substrates by HgFET technique", Solid-State Electronics, 47, 1311 (2003) was performed by the evaluation apparatus shown in FIGS. 1 and 2. The Id-Vg characteristic is shown in FIG. 3. From this figure, it can be seen that the current was rising up smoothly in a subthreshold region. Moreover, when Vbd (breakdown voltage) of the BOX film was measured, measurement from a pA level becomes possible as shown in FIG. 5.

COMPARATIVE EXAMPLE

Figure 4:
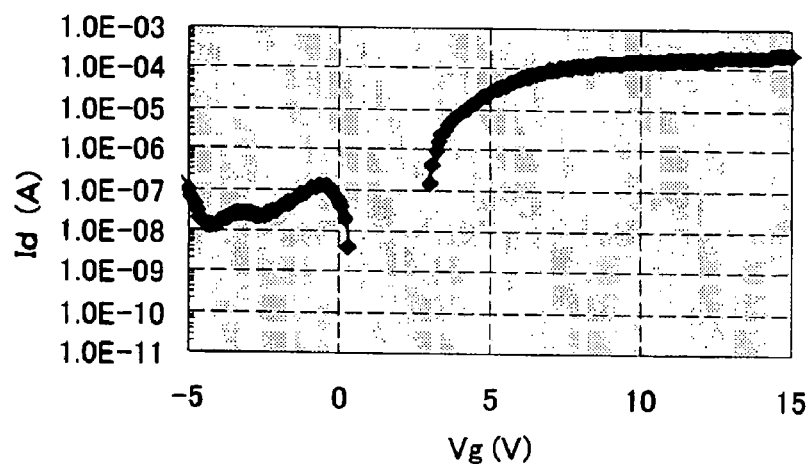
FIG. 4 is an Id-Vg curve of Comparative example.
Figure 6:
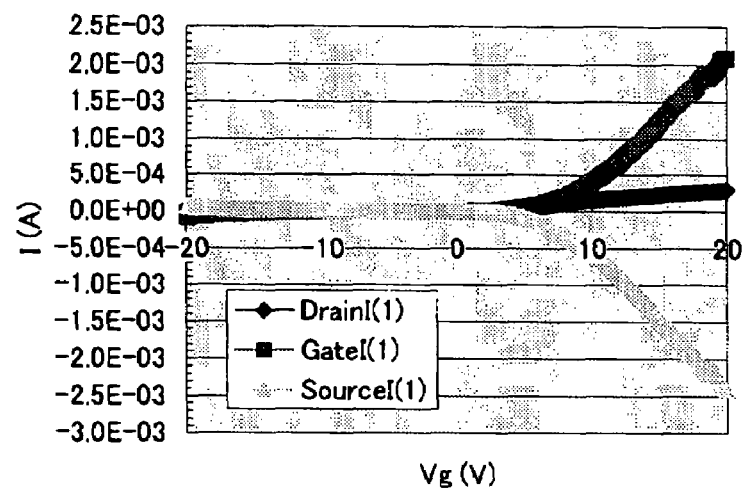
FIG. 6 is Id-Vg/Is-Vg/Ig-Vg curves in Comparative example.

In the present Comparative example, by using the same test portion as Example, the same treatment was performed, the same sample was produced. By using this sample, Pseudo-MOSFET measurement described in H. J. Hovel, "Si film electrical characterization in SOI substrates by HgFET technique", Solid-State Electronics, 47, 1311 (2003) was performed. The present Comparative example was different from Example in the point that the evaluation apparatus having a type of a wafer chuck sucking the entire surface of the wafer as the mercury probe, namely, that the diameter forming an outermost periphery of the holding surface of the wafer chuck was larger than a diameter forming an outermost periphery of the surface to be measured of the wafer. The Id-Vg characteristic is shown in FIG. 4. From this figure, it can be seen that distortion of the Id-Vg curve was generated in the negative side of Vg. Moreover, in the Vg of 2.5 V, only a level of 1E-7A was measured as the smallest current value. When the value of current flowing to the gate side was confirmed actually, the leakage to the gate side can be seen as shown in FIG. 6. Moreover, when Vbd of the BOX film was measured, the measurement of a pA level was possible in Example, and on the other hand, in Comparative example, the measurement was possible only at a level of 0.1 µA because the current flowed through the peripheral side face of the sample from the wafer chuck to the back surface side of the sample.

The present invention is not limited to the above-described embodiments. The above-described embodiments are mere examples, and those having the substantially same constitution as that described in the appended claims and providing the similar action and advantages are included in the scope of the present invention.

The invention claimed is:

1. A method for evaluating an SOI wafer, the method comprising:
   contacting a surface of the SOI wafer with a wafer chuck holding surface, the wafer chuck holding surface comprising a mercury electrode, said surface of the SOI wafer being held on the wafer chuck holding surface and in contact with the mercury electrode; and
   measuring an electric characteristic of the SOI wafer with the mercury electrode while the mercury electrode is in contact with said surface of the SOI wafer;
   wherein:
   said surface of the SOI wafer is an outer surface of a MESA part of the SOI wafer, said MESA part is a remaining portion of an SOI layer after a portion of the SOI layer is removed from the SOI wafer; and
   a diameter of an outermost periphery of the wafer chuck holding surface is equal to or greater than 0.5 and less than 1.0 times a diameter of an outermost periphery of said surface of the SOI wafer.

2. The method for evaluating an SOI wafer according to claim 1, wherein when the electric characteristic of the SOI wafer is measured, a relative humidity of an atmosphere is controlled to be less than 50%.

3. An apparatus for evaluating an SOI wafer by measuring an electric characteristic of the SOI wafer by using a mercury electrode, the apparatus comprising:
   a wafer chuck having a holding surface; and
   a probe part comprising the mercury electrode, the mercury electrode having been formed in the holding surface of the wafer chuck;
   the holding surface of the wafer chuck being configured to hold a surface of the SOI wafer so that said surface of the SOI wafer is in contact with the mercury electrode;
   wherein:
   said surface of the SOI wafer is an outer surface of a MESA part of the SOI wafer, said MESA part is a remaining portion of an SOI layer after a portion of the SOI layer is removed from the SOI wafer; and
   a diameter of an outermost periphery of the holding surface of the wafer chuck is equal to or greater than 0.5 and less than 1.0 times a diameter of an outermost periphery of said surface of the SOI wafer.

4. The app apparatus for evaluating an SOI wafer according to claim 3, further comprising a chamber for sealing in hermetically and surrounding the wafer chuck and the SOI wafer held on the wafer chuck, and an air-conditioning apparatus for controlling a relative humidity of an atmosphere in the chamber to be less than 50%.

* * * * *